(12) United States Patent
Jung et al.

(10) Patent No.: US 7,362,387 B2
(45) Date of Patent: Apr. 22, 2008

(54) PROGRAMMABLE MASK AND METHOD FOR FABRICATING BIOMOLECULE ARRAY USING THE SAME

(75) Inventors: Moon Youn Jung, Daejon-Shi (KR); Hae Sik Yang, Daejon-Shi (KR); Chi Hoon Jun, Daejon-Shi (KR); Yun Tae Kim, Daejon-Shi (KR); Young Shin Kim, Daejon-Shi (KR); Dong Ho Shin, Daejon-Shi (KR)

(73) Assignee: Electronics and Telecommunications Research Institute, Daejon (KR)

( * ) Notice: Subject to any disclaimer, the term of this patent is extended or adjusted under 35 U.S.C. 154(b) by 83 days.

(21) Appl. No.: 11/299,111

(22) Filed: Dec. 8, 2005

(65) Prior Publication Data

US 2006/0092339 A1     May 4, 2006

Related U.S. Application Data

(62) Division of application No. 10/246,593, filed on Sep. 18, 2002, now abandoned.

(30) Foreign Application Priority Data

May 15, 2002    (KR) ............................... 2002-26698

(51) Int. Cl.
    *G02F 1/13*    (2006.01)
(52) U.S. Cl. ............................. 349/2; 349/43
(58) Field of Classification Search .................. 349/2, 349/114, 43, 96, 123, 106, 187
    See application file for complete search history.

(56) References Cited

U.S. PATENT DOCUMENTS

| | | | |
|---|---|---|---|
| 5,506,929 A | 4/1996 | Tai et al. | |
| 5,592,314 A * | 1/1997 | Ogasawara et al. | 349/18 |
| 5,605,662 A | 2/1997 | Heller et al. | |
| 5,959,098 A | 9/1999 | Goldberg et al. | |
| 6,093,302 A | 7/2000 | Montgomery | |
| 6,204,905 B1 * | 3/2001 | Koma et al. | 349/138 |
| 6,271,957 B1 | 8/2001 | Quate et al. | |
| 6,303,963 B1 * | 10/2001 | Ohtani et al. | 257/350 |
| 6,379,847 B2 | 4/2002 | Cutter | |
| 6,476,893 B1 * | 11/2002 | Sasaki et al. | 349/119 |
| 6,529,253 B1 * | 3/2003 | Matsute | 349/96 |
| 6,740,890 B1 | 5/2004 | Tai | |

FOREIGN PATENT DOCUMENTS

| | | |
|---|---|---|
| KR | 2001-0002915 | 1/2001 |
| KR | 010002915 | 1/2001 |

OTHER PUBLICATIONS

Biosensore & Bioelectronics 14 (1999), 443-456.

* cited by examiner

*Primary Examiner*—Thoi V. Duong
(74) *Attorney, Agent, or Firm*—Blakely, Sokoloff, Taylor & Zafman LLP

(57) ABSTRACT

A programmable mask used in a photolithography process for fabricating a biomolecule array and a method for fabricating a biomolecule array using the same are disclosed. Particularly, a TFT-LCD type programmable mask for selectively transmitting incident light in accordance with an electrical signal applied thereto and a method for fabricating a biomolecule array using the same are provided. The ultraviolet light is selectively illuminated to a sample substrate so that the biomolecule array having high density can be fabricated.

9 Claims, 4 Drawing Sheets

PROGRAMMABLE MASK AND METHOD FOR FABRICATING BIOMOLECULE ARRAY USING THE SAME

The present patent application is a Divisional of application Ser. No. 10/246,593, filed Sep. 18, 2002 now abandoned.

BACKGROUND OF THE INVENTION

1. Field of the Invention

The present invention relates to a programmable mask adapted for fabricating a biomolecule array and a method for fabricating a biomolecule array using the same, more particularly, to a programmable mask adapted for fabricating the biomolecule array such as DNA by illuminating ultraviolet light to a specific cell and a method for fabricating a biomolecule array using the same.

2. Description of the Prior Art

First, in a biomolecule or a macromolecule array formed on a substrate, the area composed of a kind of the biomolecule or the macromolecule is referred as a cell.

The research for the operation for performing the plurality of experiment at once by using the biomolecule or macromolecule array has been progressed. As the biomolecule or macromolecule array, there are, for example, polypeptide, carbohydrate, and nucleic acid (DNA, RNA) arrays. The most important thing in the research is to fabricate an inexpensive array having high density on the substrate, effectively.

At the present time, as the method for fabricating the biomolecule or macromolecule array, there are a spotting method for dropping a biochemical material to a desired location by moving a micro-robot in three dimensions, a photolithography method for selectively illuminating light to the desired location to vary the surface thereof so that the coupling reaction between the surface and the biomolecule is generated in only a specific location, and an electric addressing method for adjusting the electrode voltage of a microelectrode array to attach the biomolecule to only a specific electrode.

The spotting method includes a contact printing method for adhering a solution on a paper like as a seal is affixed and a non-contact printing method for dropping the solution. The contact printing method is progressed in order of a loading step, a printing step, and a washing step, by using a XYZ robot. Since this method uses a pin the end of which is formed with a groove like the point of a fountain pen, the volume of the sample can be reproducibly adjusted and a plurality of printing steps can be performed when the sample is loaded one time. However, this method has a demerit which the number of the arrays per the unit area can be not increased. As the non-contact printing method, there are a dispensing method and an ink-jet printing method. The dispensing method is the method for dropping the solution like as a micropipette is used, and the ink-jet printing method is the method which a fine pressure is applied to a reservoir such that the solution blows off. If the ink-jet printing method is used, the volume of the sample solution can be finely adjusted to nano-liter such that the number of the arrays per the unit area can be remarkably increased. In this method, every sample solution needs the reservoir, but the number of the reservoirs which can be provided to the robot is limited. Accordingly, this method can be used in only case where the array is fabricated by using only a few sample solutions.

Affymetrix corporation firstly use the photolithography method in a semiconductor manufacturing process (U.S. Pat. No. 5,959,098). When the ultraviolet light is selectively illuminated to the molecule immobilized to the surface of the substrate and having protecting groups by using a photomask, the protecting group falls out and OH group appears. When the solution including biomolecule or macromolecule monomer to be attached is dropped, the biomolecule or macromolecule monomer is fixed to only the portion in which the OH group appears. Since another protection group is present in this attached macromolecule monomer, another monomer can be attached when the light is selectively illuminated. Therefore, the biomolecule or macromolecule array having a desired array can be fabricated by repeatedly performing these operations. This method can fabricate the array having high density and synthesize in parallel. However, since a plurality of photomask are required, this method brings out a problem that it takes much time and cost. Accordingly, the method for fabricating the array by operating the micromirror of a micromirror array without using the photomask was developed (U.S. Pat. No. 6,271,957). This method brings out problems that the complex optical system is required and only a mosaic pattern can be obtained.

The electronic addressing method is the method for attaching the biomolecule by using the voltage controlling function of the microelectrode array, and includes a method for moving the biomolecule having a charge into electrode surface to generate physical or chemical coupling and a method for attaching the biomolecule within thin film when the thin film is formed by an electrochemical deposition (Cosnier, Serge, "Biomolecule immobilization on electrode surfaces by entrapment or attachment to electochemically polymerized films. A review" Biosensors & Bioelectronics 14: pp. 443-456 (1999)). For example, since the DNA has many a negative charge, DNA moves toward the electrode if the electrode has positive charges. At this time, if the physical or chemical coupling between the DNA and the electrode is generated, the DNA is attached to the electrode (U.S. Pat. No. 5,605,662). Such electrode addressing method brings out problems that it can be not applied to the case where a number of arrays are used and a microelectrode array is required. In addition, a method for electrochemically changing pH around the electrode to attach the biomolecule to the selected location was developed, and Combimatrix corporation discloses a method for combining an oligonucleotide to the selected location of the microelectrode by using this concept (U.S. Pat. No. 6,090,302). However, in this method, there is a problem that the yield of each reaction is low, thereby the degree of purity of each cell is low.

As the method for fabricating the biomolecule or macromolecule, a method using a LCD (liquid crystal display) type programmable mask which the transmission of the light can be adjusted without using the micromirror array was disclosed (U.S. Pat. No. 6,271,957, Korean Patent Publication No. 2001-2915). In the LCD type programmable mask, the operation for adjusting the transmission of the light in each pixel to generate optical reaction in the cell on the substrate is repeatedly performed, thereby the biomolecule or macromolecule array is fabricated. However, the LCD type programmable mask has problems in a point of view of polarization, UV transmission, and deactivation due to ultraviolet light. Accordingly, the programmable mask satisfies the next facts.

First, since the light output from the general LCD is polarized and the protection group on the substrate generally exists therein without orientation, every protection group exist in a specific cell on the substrate can not be stripped by the light output from the LCD. Accordingly, in order to increase the reaction yield in fabricating the array, the device for changing the light output from the LCD to the non-polarized light is needed.

Second, in the general LCD, the light in range of the visible ray is transmitted, but, in order to strip the protection group, the ultraviolet light having wavelength of 330-400 nm is required. In case of an orientation film and a polarizer provided in the general LCD, since it is readily deactivated the deactivation due to the ultraviolet light, the orientation film and the polarizer which are not affected by the ultraviolet light must be used. Also, the orientation film and the polarizer whose the absorption of the ultraviolet light is low must be used.

Third, in case of the TFT-LCD type programmable mask, a light shield field (a black matrix) can prevent the transistor from be affected by the ultraviolet light, but an amorphous silicon transistor of the driving circuit can be affected by scattered ultraviolet light. This is the demerit of the conventional programmable mask. Also, since the amorphous silicon transistor has dark-conductivity higher than photoconductivity by $10^6$ times, it can not function as a switching element, thereby the arranged state of the liquid crystal can not be adjusted.

Fourth, in order to strip the protection group in synthesis of the DNA, the suitable illumination dose of the light is required. In necessary, the synthesis must be performed, changing the wavelength of a small dose of the light. Since the illumination dose of the light depends on the intensity of the light source, the illuminated time of the light, the transmissivity of the LCD type programmable mask, the illumination dose of the light must be adjusted by electrically adjusting the transmission of the programmable mask.

Fifth, if the ultraviolet light is illuminated to the biomolecule, the reaction or the deactivation therein may be generated. In order to prevent this, only the ultraviolet light having a narrow wavelength range which can strip the protection group without affecting the biomolecule must be illuminated to the cell.

Sixth, in order to maximize the number of the cells per the unit area to fabricate the biomolecule array having high density, the number of the pixels in the LCD must be minimized. In order to reduce the size of the pixel, the LCD with a built-in driving circuit must be manufactured.

As mentioned above, in order to fabricate the biomolecule or the macromolecule array, the LCD type programmable mask which can solve the above-mentioned problems is required.

SUMMARY OF THE INVENTION

Thus, the object of the present invention is to provide a LCD type programmable mask in which the protection group within a specific cell on a sample substrate can be readily stripped and the illumination dose of the light can be adequately adjusted so that the biomolecule array having high density can be fabricated.

The another object of the present invention is to provide a method for fabricating the biomolecule array having high density by using said programmable mask.

A programmable mask according to one embodiment of the present invention comprises a lower substrate of which an upper surface has a polysilicon thin film transistor for switching a pixel area in accordance with an electrical signal applied thereto, a lower pixel electrode composed of a transparent electrode and connected to the drain electrode of said thin film transistor, and an orientation film formed on said lower pixel electrode and said thin film transistor, and of which an lower surface has a polarizer formed thereon; an upper substrate of which an lower surface has an upper pixel electrode composed of a transparent electrode and an orientation film formed under said upper pixel electrode, and of which an upper surface has a polarizer formed thereon; liquid crystal injected between said lower substrate and said upper substrate and varied in accordance with a voltage applied thereto to selectively transmit light; and a driving circuit formed on the upper surface of said lower substrate, for driving the polysilicon thin film transistor in said pixel area.

A programmable mask according to another embodiment of the present invention comprises a lower substrate of which an upper surface has a polysilicon thin film transistor for switching a pixel area in accordance with an electrical signal, a lower pixel electrode composed of a transparent electrode and connected to the drain electrode of said, thin film transistor, and an orientation film formed on said lower pixel electrode and said thin film transistor; an upper substrate of which an lower surface has an upper pixel electrode composed of a transparent electrode and an orientation film formed under said upper pixel electrode, and of which an upper surface has a polarizer formed thereon; Guest-Host liquid crystal injected between said lower substrate and said upper substrate, for shielding or transmitting light by allowing the oscillation direction of linearly-polarized light to be equal or orthogonal to the light absorbing axis of a dye in accordance with a voltage applied thereto; and a driving circuit formed on the upper surface of said lower substrate, for driving the polysilicon thin film transistor in said pixel area.

A programmable mask according to further another embodiment of the present invention comprises a lower substrate of which an upper surface has a polysilicon thin film transistor for switching a pixel area in accordance with an electrical signal applied thereto, a lower pixel electrode composed of a transparent electrode and connected to the drain electrode of said thin film transistor, a first dielectric mirror formed on said lower pixel electrode for generating constructive interference of incident light, and an orientation film formed on said first dielectric mirror; an upper substrate of which lower surface has an upper pixel electrode composed of a transparent electrode, a second dielectric mirror formed on said upper pixel electrode for generating constructive interference of incident light, and an orientation film formed on said second dielectric mirror; and liquid crystal injected between said lower substrate and said upper substrate and varied in accordance with a voltage applied thereto to selectively transmitting light, wherein said first dielectric mirror and said second dielectric mirror forms a Febry-Parot type optical filter, and only the constructive-interfered light having a specific wavelength is selectively transmitted by said Febry-Parot type optical filter.

A method for fabricating a biomolecule array using the programmable mask according to the present invention comprises the steps of preparing said programmable mask; providing a sample substrate under said programmable mask; supplying a electrical signal to said programmable mask to adjusting the transmission of light in a selected pixel area by arrangement of the liquid crystal; illuminating the light selectively passing through said pixel area to said sample substrate; and generating optical reaction in a biomolecule contained in said sample substrate by the light illuminated thereto to form a biomolecule array according to the pattern of said programmable mask.

In the method for fabricating the biomolecule array, the light selectively passing through said pixel area may be changed to non-polarized light by a depolarizer so that the non-polarized light is illuminated to said sample substrate, and the optical reaction may be generated by the non-polarized light to form the biomolecule array.

In the method for fabricating the biomolecule array, said liquid crystal includes nematic liquid crystal and dye added thereto, and is Guest-Host liquid crystal which can shield or transmit light by allowing the oscillation direction of linearly-polarized light to be equal or orthogonal to the light absorbing axis of the dye in accordance with a voltage applied thereto, the arranged state of said Guest-Host liquid crystal may be adjusted by the electrical signal applied to said programmable mask to selectively irradiate the light to said sample substrate such that the biomolecule array is formed.

DETAILED DESCRIPTION OF PREFERRED EMBODIMENTS

Figure 1:
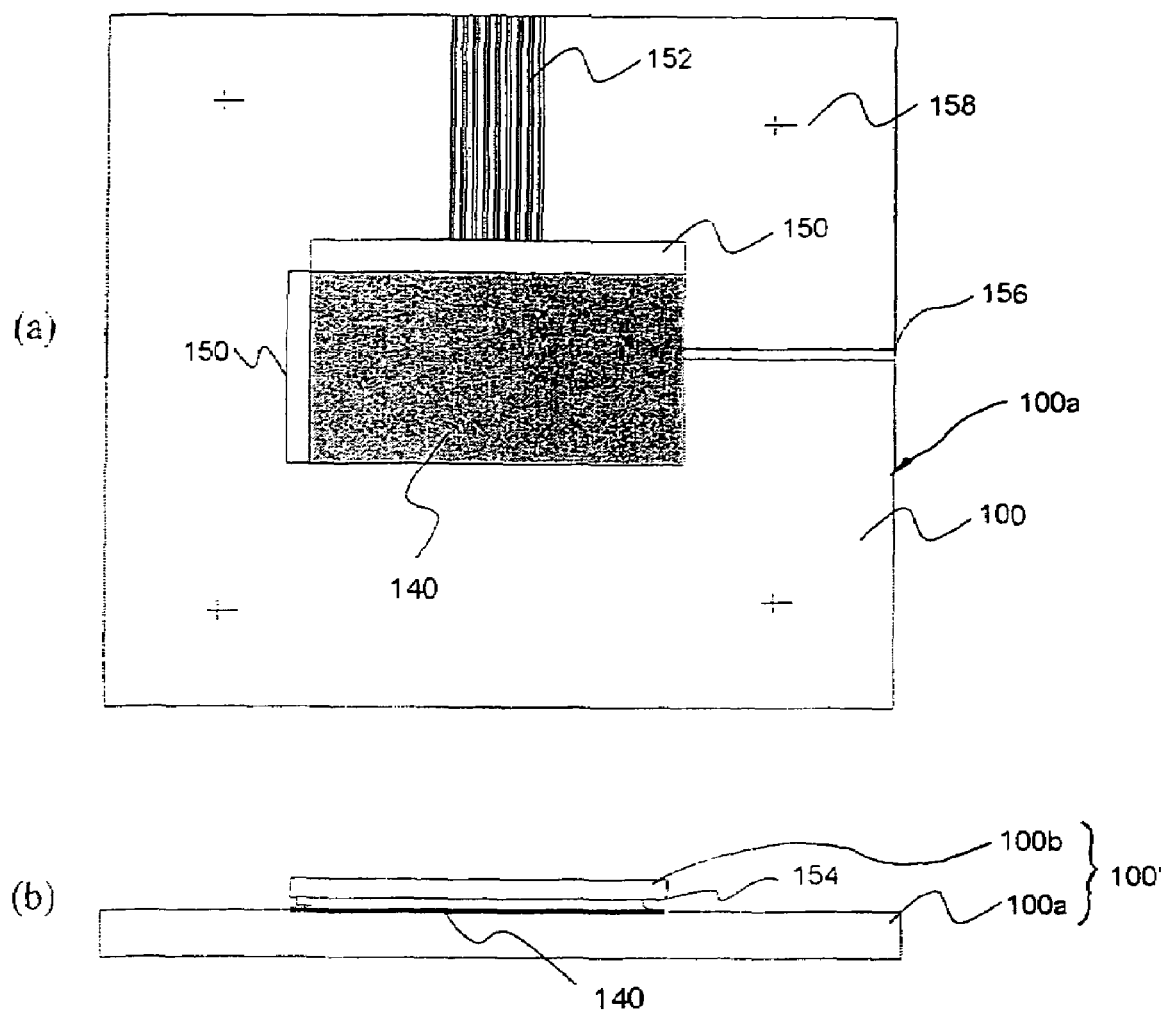
FIG. 1a is a plan view of a TFT-LCD (Thin Film Transistor-Liquid Crystal Display) type programmable mask according to the present invention.
FIG. 1b is an elevational view thereof.

Hereinafter, the preferred embodiments of the present invention will be explained with reference to the accompanying drawings. However, these embodiments are provided so that those skilled in the art can understand the present invention and it may be variously changed, and the present invention should not be understood as limited to the specific embodiments thereof. In figure, the same reference numeral indicates the same element.

Next, the structure of a LCD type programmable mask for switching the ultraviolet light and a method for manufacturing the same will be described. The structure of the LCD type programmable mask is schematically described with reference to the accompanying drawings, and a circuit diagram of the programmable mask, a sectional view of the programmable mask, the operation of the optical valve liquid crystal, and light intensity adjustment and wavelength filter function and non-polarization of the light passing through the programmable mask are described. In order to make understand the programmable mask, a method for manufacturing the panel of the polysilicon thin film transistor of the TFT-LCD type programmable mask, a method for forming a pixel, a method for injecting liquid crystal, and a method for attaching the upper and lower panels each other are described.

FIG. 1a is a plan view for illustrating the TFT-LCD type programmable mask according to the present invention, and FIG. 1b is an elevational view thereof.

Referring FIGS. 1a and 1b, the schematic structure of the TFT-LCD type programmable mask as follows. A quartz substrate 100 which has excellent transmissivity of the ultraviolet light has a rectangular shape like a general photomask, and a portion thereof is formed with a TFT-LCD type optical valve area, i.e., an ultraviolet-light-illuminated area 140 composed of an active matrix polysilicon thin film transistor array and liquid crystal. Also, the quartz substrate includes an area located at two sides of the area 140 for applying electrical signals to the gate lines of the transistors and data lines arranged in a matrix, respectively, a area for selecting the pixel to be switched (applying a gate signal and a source signal to the transistor of the pixel to be selected), an driving circuit (an integrated circuit) area 150 formed on the same plane simultaneously in the process the active matrix transistor is manufactured, and an electrode pad 152 for connecting the driving circuit with an external integrated circuit. A flexible printed circuit is bonded to the electrode pad 152. In addition, the outside of the quartz substrate 100 of the programmable mask including the polysilicon thin film transistor is formed with aligning keys 158 at four points. The quartz substrate 100 having the above-mentioned structure is referred as a lower substrate 100a. As mentioned above, when the lower substrate 100a composed of the driving circuit including the polysilicon thin film transistor and the electrode pad 152 is formed, an upper substrate 100b which is the opposite substrate thereof for injecting the liquid crystal and is formed with pixels corresponding to the pixels on the lower substrate 100a respectively is manufactured. The lower substrate 100a has a thickness of 2-5 mm so as to endure the bending due to external force as the main body of the mask, and the upper substrate 100b has a thickness of 0.1-0.6 mm such that the absorption of the ultraviolet light can be minimized. In order to maintain a certain interval therebetween, an adhesive portion 154 is formed between the lower substrate 100a and the upper substrate 100b, the liquid crystal is injected between the lower substrate 100a and the upper substrate 100b through a liquid injecting hole 156, and then the substrates are sealed. Like this, the lower substrate 100a and the upper substrate 100b are attached each other, and the liquid crystal is injected therebetween, and then the substrates are sealed, thereby the programmable mask 100' according to the present invention can be manufactured.

Figure 2:
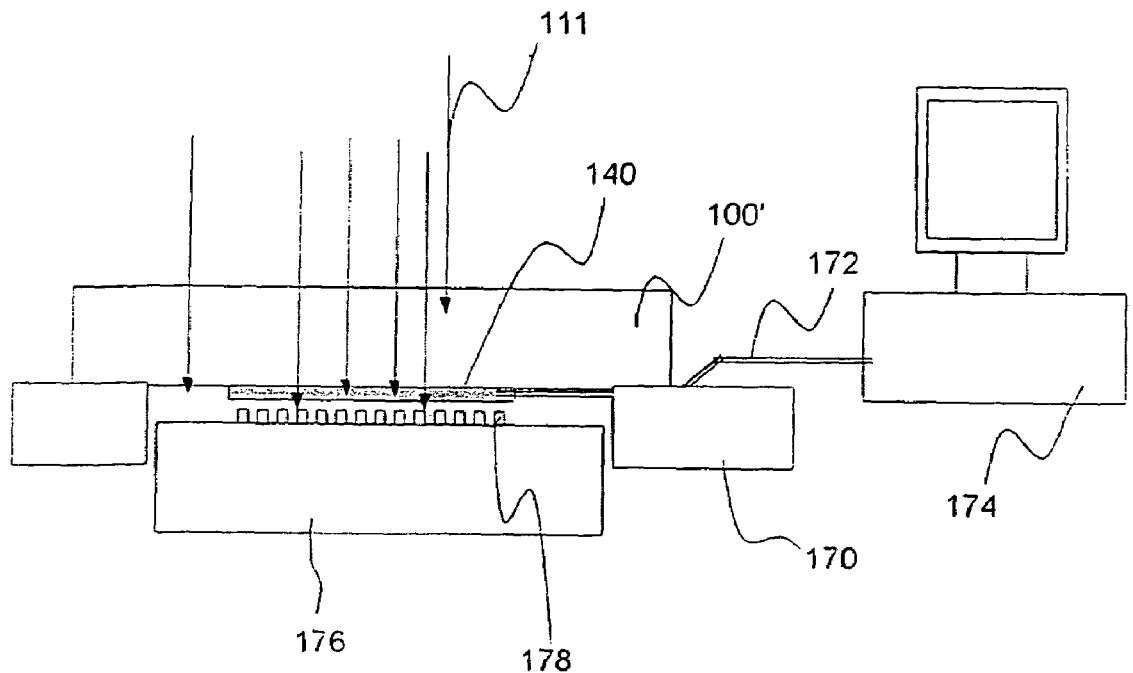
FIG. 2 is a schematic view for illustrating a photolithography operation using the TFT-LCD type programmable mask according to the present invention.

FIG. 2 is a schematic view for illustrating a photolithography operation performed by illuminating the ultraviolet light to the programmable mask and the sample substrate. FIG. 2 illustrates the photolithography operation performed in case where is applied to a device such as a contact type mask aligner.

Referring to FIG. 2, generally, the mask having a patterned chromium on the quartz substrate is used as the mask, but the present invention uses the programmable mask 100' in which the lower substrate 100a and the upper substrate 100b are attached each other shown in FIGS. 1a and 1b. This mask 100' is laid on a support base 170, and the sample substrate 176 to be formed with the biomolecule or macromolecule is positioned below the programmable mask 100', and the programmable mask 100' and the sample substrate 176 are fixed such that the aligning keys thereof are matched each other, and then data programmed in a personal computer 174 are supplied through a connecting portion 172 to operate a desired transistor on the matrix such that the liquid crystal is switched. The pattern 178 shown in FIG. 2 is the pattern of the biomolecule or macromolecule synthesized by repeatedly illuminating the ultraviolet light 111.

Figure 3:
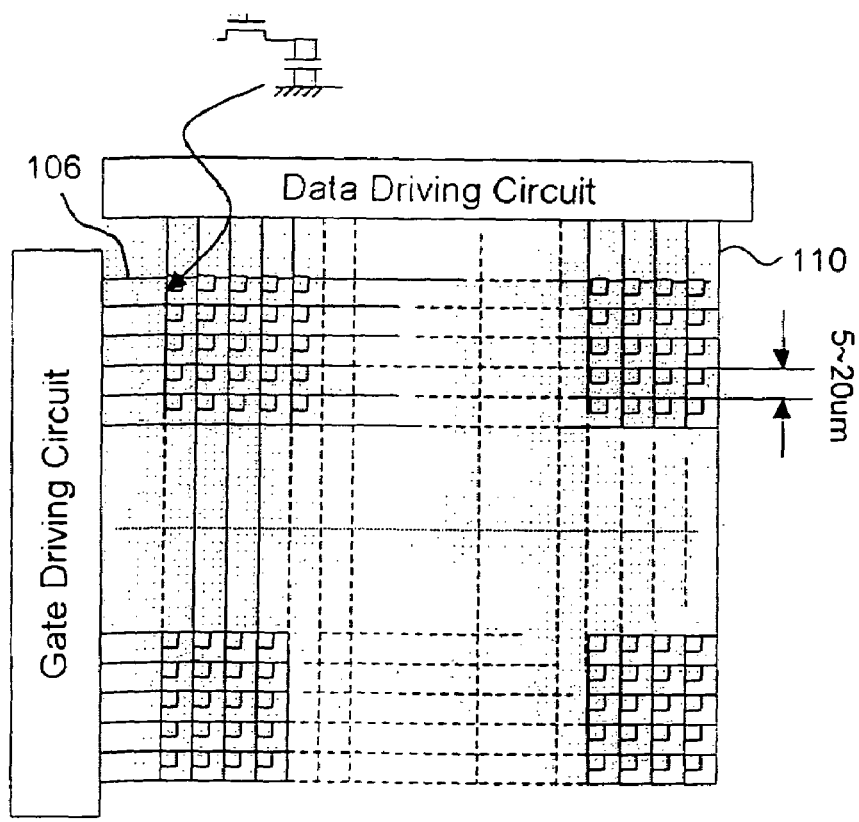
FIG. 3 is a circuit diagram of an active matrix programmable mask with a built-in driving circuit.

FIG. 3 is a circuit diagram of the programmable mask with a built-in driving circuit, having a polysilicon drive integrated circuit therein, according to the preferred embodiment of the present invention.

Referring to FIG. 3, the programmable mask according to the present invention is characterized in that it is integrated with the driving circuit, because it has a purpose for synthesizing the DNA of the high density, and the polysilicon thin film transistor is arranged in the pixel portion. In FIG. 3, the array of the high density can be formed by providing the built-in driving circuit composed of the polysilicon thin film transistor at the periphery of the pixel area. Such active matrix programmable mask with the built-in driving circuit has the merit that the ultraviolet light can be precisely adjusted and the high density can be accomplished. The programmable mask according to the present invention has the polysilicon thin film transistor formed in the pixel area and the built-in driving circuit formed simultaneously in the process for manufacturing the pixel at the periphery of the pixel area. In order to directly connect the circuit to the gate line 106 and the data line 110, the pixel area and the driving circuit whose the active layer of the transistor is formed of the polysilicon are formed in the same plane. In order to stably driving the liquid crystal, a storage electrode having a wide area for maximizing the capacitance of the above-mentioned electrode of a commercial TFT-LCD is formed in the pixel area.

Figure 4:
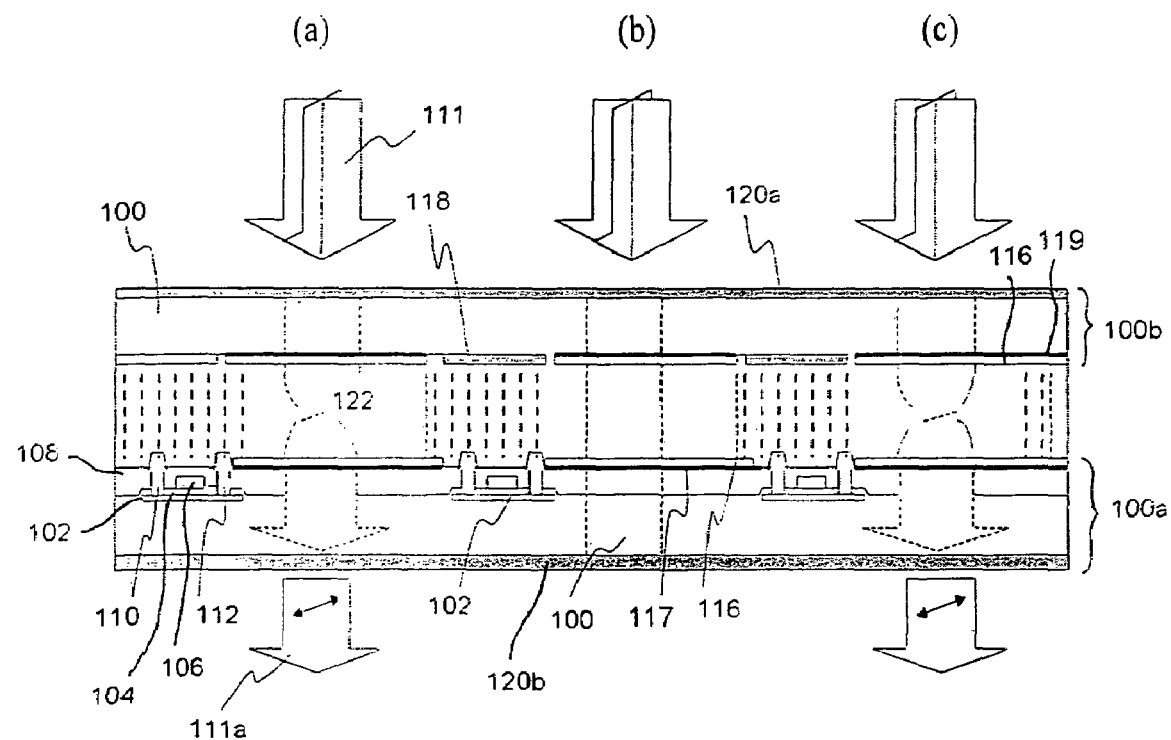
FIG. 4 is a section view of the active matrix programmable mask with the built-in driving circuit according to one embodiment of the present invention.

FIG. 4 is a section view of the active matrix programmable mask with the built-in driving circuit according to the one embodiment of the present invention.

Referring to FIG. 4, the fabricating method thereof will be explained. A polysilicon thin film 102 is formed on a quartz substrate 100 having a thickness of 2-5 mm by an excimer laser annealing method or a furnace annealing method, and then a gate insulating film 104 is formed by a PECVD (Plasma Enhanced Chemical Vapor Deposition) or a high-temperature oxidation method. Thereafter, a gate electrode 106 composed of a doped polysilicon or metal is formed thereon. After an interlayer insulating film 108 is deposited and a source electrode 110 and a drain electrode 112 are formed, a lower pixel electrode 117 composed of the transparent electrode such as ITO (Indium Tin Oxide) and connected with the drain electrode 112 is formed. And, an orientation film 116 for allowing the liquid crystal to be oriented is formed. The above-mentioned process is the method for manufacturing the lower substrate 100a. The method for manufacturing the upper substrate 100b is progressed as follows. A shielding film 118 for shielding the ultraviolet light illuminated to the thin film transistor is formed on a quartz substrate 100 having a thickness of 100-600 μm and a protecting film (not shown) is formed, and then an orientation film 116 and an upper pixel electrode 119 composed of a transparent electrode and applied with a common voltage are formed under the protection film. The upper substrate 100b and the lower substrate 100a manufactured as mentioned above are attached each other in the order of the general TFT-LCD process. After the attachment process thereof is finished, a polarizer 120a and a polarizer 120b orthogonal to the polarizer 120a are attached to the substrates 100a and 100b. FIGS. 4(a) and 4(c) show the state that the polarized light 111a is output through the liquid crystal 122 when a ground voltage (0 V) is applied to the upper and lower end of the liquid crystal 122. At this time, the ultraviolet light 111 rotated by 90 degree passes through the liquid crystal 122. FIG. 4(b) shows the state that the linearly-polarized ultraviolet light output through the upper polarizer 120a is shielded in the lower polarizer 102b when a source voltage is applied to the transparent electrode 117 according to an operation of the polysilicon thin film transistor. At this time, the linearly-polarized ultraviolet light is not rotated in the liquid crystal, so that the direction of the linearly-polarized light is maintained. By combining one polysilicon thin film transistor and one liquid pixel shown in FIG. 4, the dense programmable mask having a size of 10-20 μm can be fabricated.

The polarizers 120a and 120b can be implemented by using a macromolecule film having a transmissivity and a tolerance with respect to the ultraviolet light, i.e., an organic polymer substance, and an inorganic crystal having birefringence characteristics. As the representative organic polymer, there is polyvinyl alcohol (PVA), and, as the inorganic crystal, there are calcite, quartz, tourmaline, sodium nitrate, rutile, and $TiO_2$. Concretely, a linear polarizer using the organic polymer dealt in Newport corporation (Model No. 20LP-UV) and a Glan-Thomson calcite polarizer composed of the inorganic crystal (Model NO. 10GT04).

As the orientation film 116, a substance of which a transmissivity for ultraviolet light having the wavelength of 330-400 nm is high and deactivation is not generated is used. For example, as the orientation 116, an ultraviolet-resistant polyimid film, a silicon oxide film formed by a slope sputtering method or a slope thermal deposition method, or a DLC (Diamond-like-carbon) film for allowing the liquid crystal to be oriented by illuminating an ion beam can be used.

Figure 5:
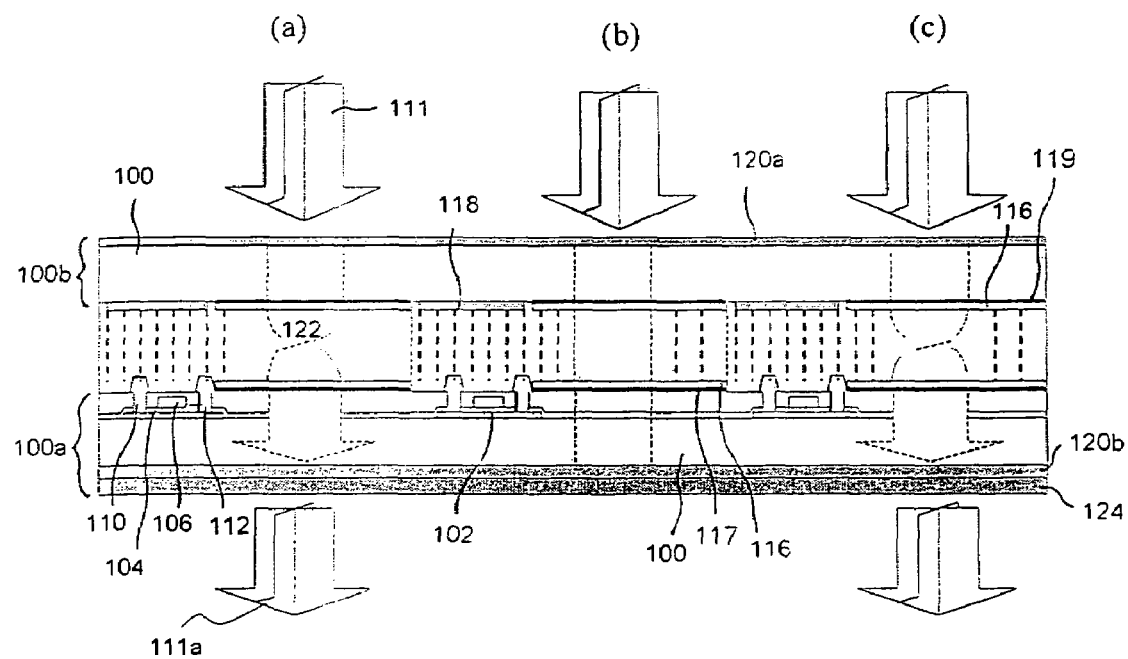
FIG. 5 is a section view of the active matrix programmable mask with the built-in driving circuit, having a depolarizer.

FIG. 5 shows a case where a depolarizer for removing the polarized property 124 is attached under the polarizer 120b.

Referring to FIG. 5, the light 111a passing through the depolarizer 124 is similar to the incident light 111, except for the intensity of light. By further comprising the depolarizer 124, the non-polarized light is illuminated to the sample substrate (see '176' in FIG. 2) to generate the optical reaction, thereby the biomolecule or macromolecule array can be fabricated.

Figure 6:
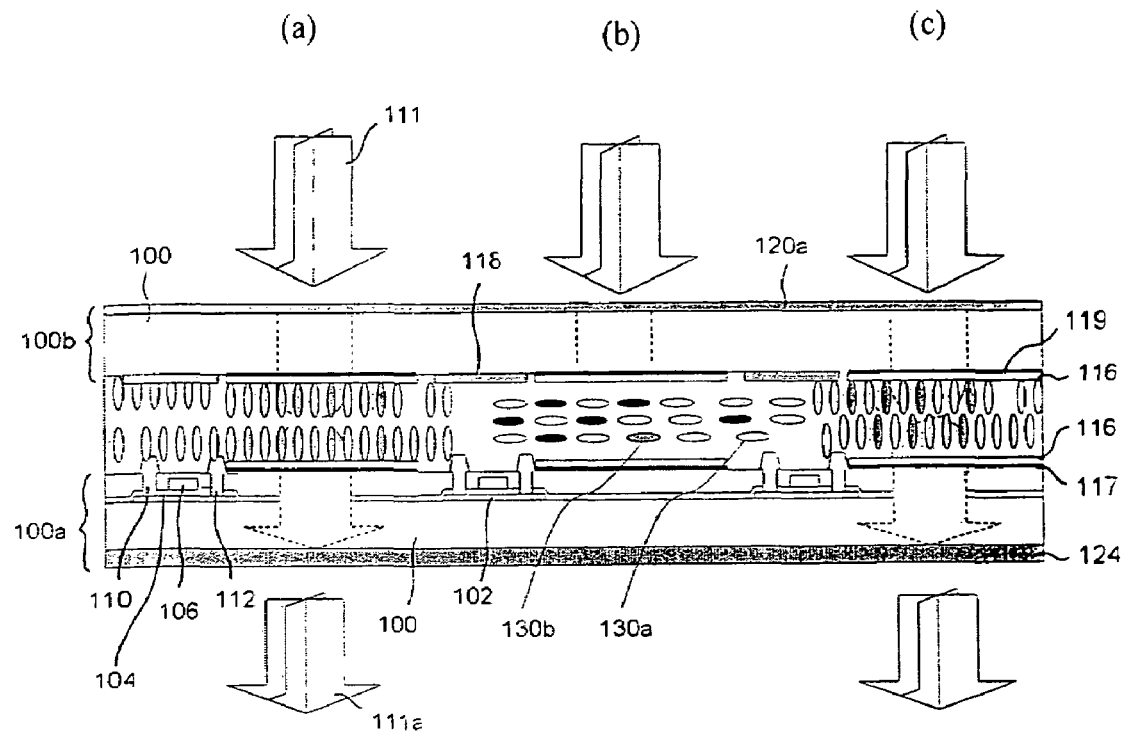
FIG. 6 is a section view for illustrating the active matrix programmable mask with the built-in driving circuit according to another embodiment of the present invention.

FIG. 6 is a section view for illustrating the active matrix programmable mask with the built-in driving circuit according to another embodiment of the present invention.

Figure 7:
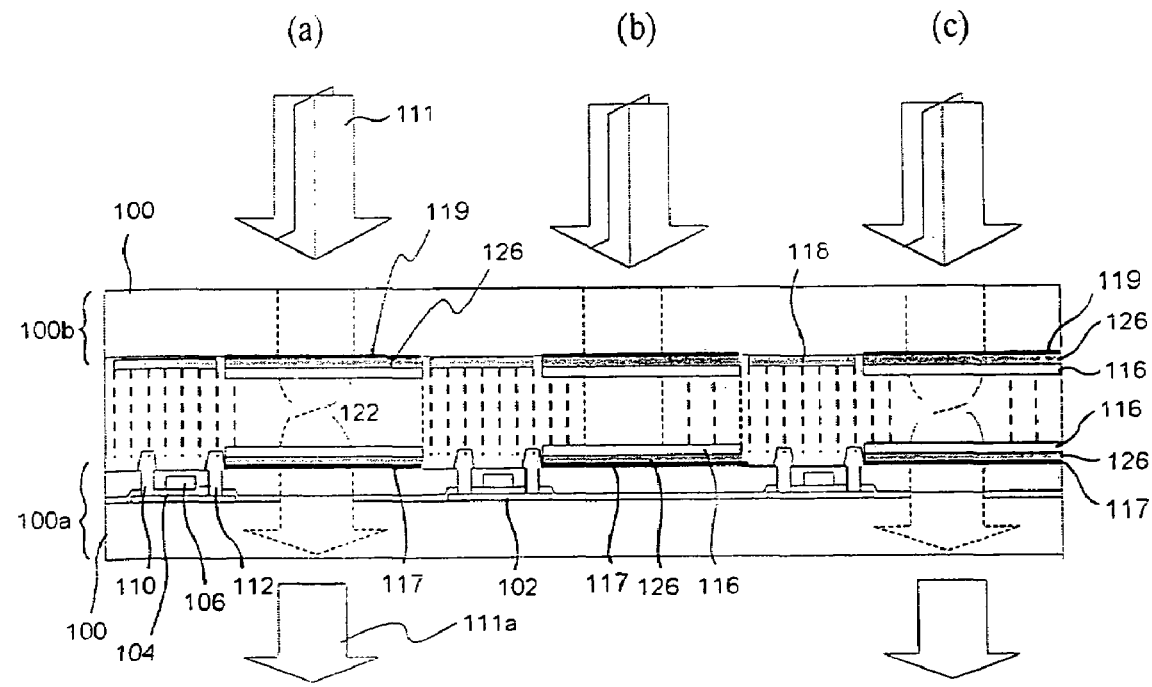
FIG. 7 is a section view for illustrating the active matrix programmable mask with a built-in driving circuit according to further another embodiment of the present invention.

Referring to FIG. 6, the programmable mask shown in FIG. 6 switches the light in the method different from that of the programmable mask shown in FIG. 4. That is, in FIG. 4, the two polarizers 120a and 120b can be used, but, in FIG. 6, one polarizer 120a is used and Guest-Host type liquid crystals 130a, 130b are used as the liquid crystal. While the general liquid crystal (see '122' in FIG. 4) allows the incident polarized light to pass therethrough, rotating the direction thereof or not, the Guest-Host type liquid crystals 130a, 130b itself shields the light. The ultraviolet light 111 is strongly absorbed to dichroic dye 130b. If the voltage is not applied to the Guest-Host type liquid crystals 130a, 130b (FIG. 6(b)), because the oscillating direction of the linearly-polarized light from the polarizer 120a is equal to the light absorbing axis of the dye 130b, the light is absorbed so that the transmitted light is dyed, thereby the ultraviolet light 111 is strongly absorbed to the dye 130b so as to do not transmit the programmable mask. Otherwise, if the voltage is applied to the Guest-Host type liquid crystals 130a, 130b (FIGS. 6(a) and 6(c)), because the oscillating direction of the linearly-polarized light from the polarizer 120a is orthogonal to the light absorbing axis, the light is not absorbed in principle so that the transmitted light is not dyed, thereby the ultraviolet light 111 is hardly absorbed to transmit the programmable mask. Regardless of the number of the wavelengths of the incident ultraviolet light 111, the wavelength of the ultraviolet light 111a passing through the mask is equal to that of the incident ultraviolet light 111. That is, no variation is generated, except for the intensity of the light. If only the light having a specific wavelength must be used when the biomolecule or macromolecule array is fabricated, the incident ultraviolet generating device according to the embodiment of the present invention must be provided with a fine adjustable optical filter under the ultraviolet light source and an ultraviolet laser source must be used. If the optical filter is used, it is troublesome when the ultraviolet light having a plurality of wavelengths is needed. If the ultraviolet laser source is used, the device for fabricating the array is limited, because almost ultraviolet laser source has a pulse shape. Accordingly, in the present invention, a Fabry-Parot type wavelength-variable liquid crystal filter for transmitting only the light having the needed wavelength among the light having a plurality of the wavelengths is arranged on the mask in matrix. The basic principle of the Fabry-Parot type filter using the liquid crystal is to transmit only the constructive-interfered light by the variation of n or d in the condition that the light repeatedly reflected between the dielectric mirrors is constructive-interfered, that is, an equation $n d\cos\theta = m \lambda/2$ (n=refractive index, d=thickness of the liquid crsytal). Since the thickness of the liquid crystal is fixed, the liquid crystal filter can transmit only the light having a desired wavelength by the variation of the reflective index n. The variation of n can be actually adjusted by the variation of the voltage across the both ends of the liquid crystal. This type of the filter is constructed by arranging a wavelength division multiplexing liquid crystal filter on the programmable mask so as to be driven by the polysilicon transistor, in the optical communication system. FIG. 7 is a section view for illustrating the active matrix programmable mask with the built-in driving circuit according to further another embodiment of the present invention. Referring to FIG. 7, the programmable mask includes a Fabry-Parot wavelength-variable liquid crystal filter, and is different from the structure in FIGS. 4 to 6 in that the dielectric mirrors 126 are located on the both ends of the liquid crystal. The other words, the dielectric mirror 126 for generating the constructive interference of the incident ultraviolet light are provided on the lower pixel electrode 117 composed of the transparent electrode and connected with the drain electrode 112 of the polysilicon thin film transistor in the lower substrate 100a, and the orientation film 116 is provided on the dielectric mirror 126. Also, the dielectric mirror 126 for generating the constructive interference of the incident ultraviolet light is provided under the upper pixel electrode 119 composed of the transparent electrode and applied with the common voltage in the upper substrate 100b, and the orientation film 116 is provided under the dielectric film 126. The thickness of the liquid crystal and the reflectivity of the dielectric mirror 126 selected thereat is determined by calculation. Since the light having the wavelength selected thereat is in the linearly-polarized state, it can be changed to the non-polarized light by the above-mentioned depolarizer (see '124' in FIG. 5). As mentioned above, according to the present invention, the programmable mask includes a LCD panel in which the color filter layer is removed and the depolarizer and the transmission of the non-polarized ultraviolet light is adjusted, thereby the biomolecule or macromolecule array such as DNA can be effectively fabricated.

According to the present invention, the volume of the device can be reduced in comparison with the existing optical mask or micromirror array and the inexpensive array of high density can be readily fabricated. Also, mass production of the biomolecule or macromolecule array can be readily performed in case where a stepping function exists or many an array pattern exist in a programmable mask. Since the liquid crystal, the orientation film, the substrate, and the polarizer which allows the ultraviolet light to pass therethrough and is not deactivated by the ultraviolet light are used, the programmable mask can be used for a long time. In addition, if which the polysilicon thin film transistor is used instead of the amorphous silicon, it can be used for a longer time, because the stability for dispersion of the light becomes high. In case where the LCD with a built-in driving circuit is used, the dense biomolecule or macromolecule array in which the size of the cell is small can be fabricated. Because the photolithography condition can be readily adjusted by adjusting the intensity or the wavelength of the light passing through the programmable mask, the biomolecule or macromolecule array of high yield can be fabricated. Also, in case where such programmable mask is fabricated in a small size, it is can be utilized as a DNA chip manufacturing device which can be used in a hospital or a laboratory. Accordingly, the DNA chip of high density can be inexpensively fabricated.

The invention claimed is:

1. A method for fabricating a biomolecule array using a programmable mask having a lower substrate of which an upper surface has a polysilicon thin film transistor for switching a pixel area in accordance with an electrical signal applied thereto, a lower pixel electrode composed of a transparent electrode and connected to a drain electrode of said thin film transistor, and an orientation film formed on said lower pixel electrode and said thin film transistor that operates to orientate a liquid crystal, and of which a lower surface has a polarizer formed thereon; an upper substrate of which a lower surface has an upper pixel electrode composed of a transparent electrode and an orientation film formed under said upper pixel electrode, and of which an upper surface has a polarizer formed thereon and is positioned orthogonal to the polarizer formed on the lower surface of the thin film transistor; the liquid crystal is injected between said lower substrate and said upper substrate and varied in accordance with a voltage applied thereto to selectively transmit the light; and a driving circuit formed on the upper surface of said lower substrate, for driving the polysilicon thin film transistor in said pixel area, said method comprising the steps of:

preparing said programmable mask;
removing a color filter from said programmable mask;
providing a sample substrate under said programmable mask;
supplying an electrical signal to said programmable mask for adjusting the transmission of light in a selected pixel area by arrangement of the liquid crystal;
illuminating the light selectively passing through said pixel area to said sample substrate; and
generating optical reaction in a biomolecule contained in said sample substrate by the light illuminated thereto to form a biomolecule array according to the pattern of said programmable mask,
wherein ultraviolet light passes through the liquid crystal without deactivating said programmable mask.

2. The method for fabricating the biomolecule array according to claim 1, wherein the light selectively passing through said pixel area is changed to non-polarized light by a depolarizer so that the non-polarized light is illuminated to said sample substrate, and the optical reaction is generated by the non-polarized light to form the biomolecule array.

3. The method for fabricating the biomolecule array according to claim 1, wherein said liquid crystal includes nematic liquid crystal and dye added thereto, and is Guest-Host liquid crystal which can shield or transmit light by allowing the oscillation direction of linearly-polarized light to be equal or orthogonal to the light absorbing axis of the dye in accordance with a voltage applied thereto, wherein the arranged state of said Guest-Host liquid crystal is adjusted by the electrical signal applied to said programmable mask to selectively irradiate the light to said sample substrate such that the biomolecule array is formed.

4. A method for fabricating a biomolecule array using a programmable mask having a lower substrate of which an upper surface has a polysilicon thin film transistor for switching a pixel area in accordance with an electrical signal, a lower pixel electrode composed of a transparent electrode and connected to a drain electrode of said thin film transistor, and an orientation film formed on said lower pixel electrode and said thin film transistor that operates to orientate Guest-Host liquid crystal; an upper substrate of which a lower surface has an upper pixel electrode composed of a transparent electrode and an orientation film formed under said upper pixel electrode, and of which an upper surface has a polarizer formed thereon, the polarizer formed on the upper surface of the thin film transistor is positioned orthogonal to a polarizer formed on the lower surface of the thin film transistor; the Guest-Host liquid crystal is injected between said lower substrate and said upper substrate, for shielding or transmitting light by allowing the oscillation direction of linearly-polarized light to be equal or orthogonal to the light absorbing axis of a dye in accordance with a voltage applied thereto; and a driving circuit formed on the upper surface of said lower substrate, for driving the polysilicon thin film transistor in said pixel area, said method comprising the steps of:

preparing said programmable mask;

removing a color filter from said programmable mask;

providing a sample substrate under said programmable mask;

supplying an electrical signal to said programmable mask for adjusting the transmission of light in a selected pixel area by arrangement of the liquid crystal;

illuminating the light selectively passing through said pixel area to said sample substrate; and generating optical reaction in a biomolecule contained in said sample substrate by the light illuminated thereto to form a biomolecule array according to the pattern of said programmable masks, wherein ultraviolet light passes through the Guest-Host liquid crystal without deactivating said programmable mask.

5. The method for fabricating the biomolecule array according to claim 4, wherein the light selectively passing through said pixel area is changed to non-polarized light by a depolarizer so that the non-polarized light is illuminated to said sample substrate, and the optical reaction is generated by the non-polarized light to form the biomolecule array.

6. The method for fabricating the biomolecule array according to claim 4, wherein said liquid crystal includes nematic liquid crystal and dye added thereto, and is Guest-Host liquid crystal which can shield or transmit light by allowing the oscillation direction of linearly-polarized light to be equal or orthogonal to the light absorbing axis of the dye in accordance with a voltage applied thereto, wherein the arranged state of said Guest-Host liquid crystal is adjusted by the electrical signal applied to said programmable mask to selectively irradiate the light to said sample substrate such that the biomolecule array is formed.

7. A method for fabricating a biomolecule array using a programmable mask having a lower substrate of which an upper surface has a polysilicon thin film transistor for switching a pixel area in accordance with an electrical signal applied thereto, a lower pixel electrode composed of a transparent electrode and connected to a drain electrode of said thin film transistor, a first dielectric mirror formed on said lower pixel electrode for generating constructive interference of incident light, and an orientation film formed on said first dielectric mirror that operates to orientate liquid crystal; an upper substance of which a lower surface has an upper pixel electrode composed of a transparent electrode, a second dielectric mirror formed on said upper pixel electrode for generating constructive interference of incident light, and an orientation film formed on said second dielectric mirror; and the liquid crystal is injected between said lower substrate and said upper substrate and varied in accordance with a voltage applied thereto to selectively transmitting light, wherein said first dielectric mirror and said second dielectric mirror forms a Febry-Parot type optical filter, and only the constructive-interfered light having a specific wavelength is selectively transmitted by said Febry-Parot type optical filter, said method comprising the steps of:

preparing said programmable mask;

removing a color filter from said programmable mask;

providing a sample substrate under said programmable mask;

supplying an electrical signal to said programmable mask for adjusting the transmission of light in a selected pixel area by arrangement of the liquid crystal;

illuminating the light selectively passing through said pixel area to said sample substrate; and generating optical reaction in a biomolecule contained in said sample substrate by the light illuminated thereto to form a biomolecule array according to the pattern of said programmable mask, wherein ultraviolet light passes through the liciuid crystal without deactivating said programmable mask.

8. The method for fabricating the biomolecule array according to claim 7, wherein the light selectively passing through said pixel area is changed to non-polarized light by a depolarizer so that the non-polarized light is illuminated to said sample substrate, and the optical reaction is generated by the non-polarized light to form the biomolecule array.

9. The method for fabricating the biomolecule array according to claim 7, wherein said liquid crystal includes nematic liquid crystal and dye added thereto, and is Guest-Host liquid crystal which can shield or transmit light by allowing the oscillation direction of linearly-polarized light to be equal or orthogonal to the light absorbing axis of the dye in accordance with a voltage applied thereto, wherein the arranged state of said Guest-Host liquid crystal is adjusted by the electrical signal applied to said programmable mask to selectively irradiate the light to said sample substrate such that the biomolecule array is formed.

* * * * *